United States Patent
Kris et al.

(10) Patent No.: US 10,003,353 B2
(45) Date of Patent: Jun. 19, 2018

(54) TIME-BASED DELAY LINE ANALOG COMPARATOR

(71) Applicant: Microchip Technology Incorporated, Chandler, AZ (US)

(72) Inventors: Bryan Kris, Gilbert, AZ (US); Jim Bartling, Chandler, AZ (US); Neil Deutscher, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days. days.

(21) Appl. No.: 15/652,710

(22) Filed: Jul. 18, 2017

(65) Prior Publication Data

US 2018/0026648 A1  Jan. 25, 2018

Related U.S. Application Data

(60) Provisional application No. 62/364,164, filed on Jul. 19, 2016.

(51) Int. Cl.
| | |
|---|---|
| *H03M 1/12* | (2006.01) |
| *H03M 1/50* | (2006.01) |
| *H03K 5/14* | (2014.01) |
| *H03K 5/24* | (2006.01) |

(52) U.S. Cl.
CPC .............. *H03M 1/502* (2013.01); *H03K 5/14* (2013.01); *H03K 5/24* (2013.01); *H03M 1/1205* (2013.01)

(58) Field of Classification Search
CPC ...... H03M 1/502; H03M 1/1205; H03K 5/14; H03K 5/24

USPC .................................................. 341/130–155
See application file for complete search history.

(56) References Cited

U.S. PATENT DOCUMENTS

| | | | | | |
|---|---|---|---|---|---|
| 5,661,427 | A | * | 8/1997 | McBride | H03K 5/14 327/149 |
| 5,673,005 | A | * | 9/1997 | Pricer | H03B 5/20 327/182 |
| 5,892,384 | A | * | 4/1999 | Yamada | G06F 1/04 327/277 |

(Continued)

OTHER PUBLICATIONS

Lukić, Zdravko et al., "Multibit Σ-Δ PWM Digital Controller IC for DC-DC Converters Operating at Switching Frequencies Beyond 10 MHz," IEEE Transactions on Power Electronics, vol. 22, No. 5, pp. 1693-1707, Sep. 1, 2007.

(Continued)

*Primary Examiner* — Lam T Mai
(74) *Attorney, Agent, or Firm* — Slayden Grubert Beard PLLC

(57) ABSTRACT

Embodiments of the present disclosure include voltage comparators. The voltage comparators may include a first input configured to receive a first analog voltage, a second input configured to receive a second analog voltage, a first digital delay line configured to propagate the first analog voltage through a first delay circuit and the second analog voltage through a second circuit, and an output circuit configured to provide a comparator output based upon whether values representing the first analog voltage or the second analog voltage propagated faster through the first digital delay line. The comparator output may be configured to identify whether the first analog voltage or the second analog voltage is greater.

20 Claims, 13 Drawing Sheets

(56) References Cited

U.S. PATENT DOCUMENTS

| | | | | |
|---|---|---|---|---|
| 6,295,473 | B1* | 9/2001 | Rosar | A61N 1/08 128/903 |
| 2006/0273831 | A1* | 12/2006 | Maksimovic | H03M 1/1042 327/103 |
| 2010/0134083 | A1* | 6/2010 | Trescases | G04F 10/005 323/283 |
| 2011/0181361 | A1* | 7/2011 | Nolan | H03F 1/30 330/278 |
| 2011/0187907 | A1* | 8/2011 | Takahashi | H01L 27/146 348/302 |
| 2011/0285568 | A1* | 11/2011 | Harpe | H03M 1/56 341/158 |
| 2015/0115925 | A1 | 4/2015 | Teh et al. | 323/283 |

OTHER PUBLICATIONS

Chan, Man Pun et al., "Fully Integrated Digital Controller IC for Buck Converter with a Differential-Sensing ADC," IEEE International Conference on Electron Devices and Solid-State Circuits, 4 pages, Dec. 8, 2008.

Chebli, R. et al., "Adjustable Input Self-Strobed Delay Line ADC Intended to Implantable Devices," IEEE International Symposium on Circuits and Systems, pp. 2297-2300, May 15, 2011.

International Search Report and Written Opinion, Application No. PCT/US2017/042705, 18 pages, Oct. 9, 2017.

\* cited by examiner

Adc_avss - ANALOG Vss
Adc_avdd - ANALOG Vdd
Vinp_ana[] - POSITIVE ANALOG VOLTAGE INPUT
Vinn_ana[] - NEGATIVE ANALOG VOLTAGE INPUT
Range_mv[] - WHEN ASSERTED, DOUBLE THE RANGE OF INPUT VOLTAGE: 0: INPUT RANGE +/- 0.2V; 1: INPUT RANGE +/- 0.4V
V2itrim_mv - TRIM VOLTAGE ACCORDING TO OUTSIDE LEVELS
Isrc_ana[] - BIAS CURRENT ADJUSTMENTS
Pbias_ana - pbias OUTPUT
Nbias_ana - nbias OUTPUT

TIME-BASED DELAY LINE ANALOG COMPARATOR

PRIORITY

The present application claims priority to U.S. Provisional Application 62/364,164 filed Jul. 19, 2016 and which are hereby incorporated in their entirety.

TECHNICAL FIELD

The present disclosure relates to time-based digital delay line (DDL) analog to digital converters (ADC), in particular such converters used in a comparator.

BACKGROUND

Many different kinds of ADCs exist and their use often depends on the application. ADCs may vary according to a bit size, wherein the analog signal will be digitized into $2^n$ different digital values, wherein the ADC is an n-bit converter, using n-bits to represent the range of analog values. Moreover, ADCs may include an input range for the analog signal. The lowest digitized output of the ADC (e.g., 00000000 for an 8-bit ADC) may correspond to the lower limit of analog signal input. The highest digitized output of the ADC (e.g., 11111111 for an 8-bit ADC) may correspond to the upper limit of analog signal input. Such example values may specify positive or unsigned values, though two's complement binary enumeration may be used instead. An ADC may have a defined bandwidth that may correspond to a sampling rate, or how often the analog signal is sampled. The ADC may output values according to varying degrees of linearity.

SUMMARY

Figure 1:
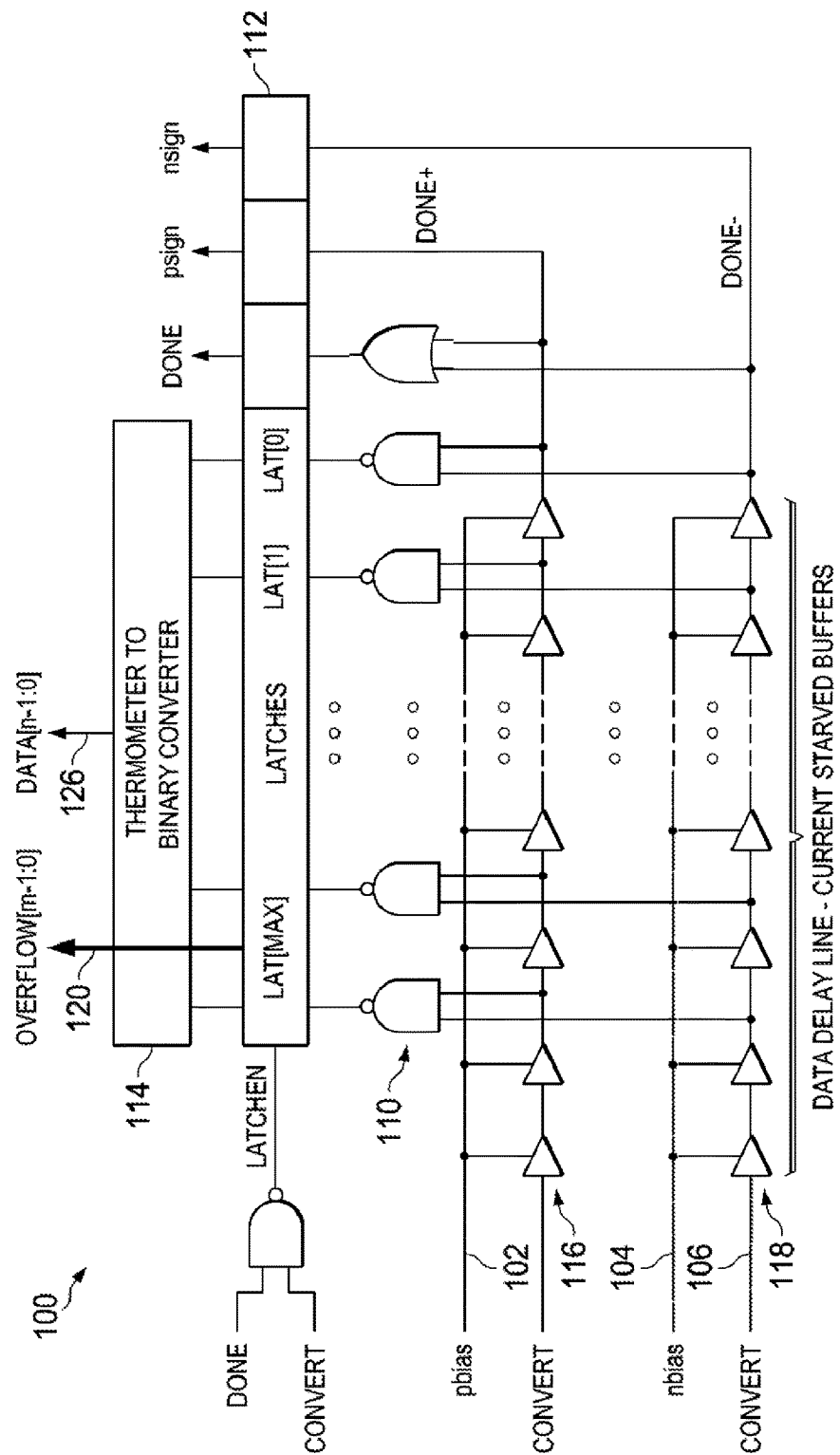
FIG. 1 illustrates an example over range protection variable resolution differential delay line ADC, according to embodiments of the present disclosure.

Embodiments of the present disclosure may include voltage comparators. The voltage comparators may include a first input configured to receive a first analog voltage, a second input configured to receive a second analog voltage, a first digital delay line configured to propagate the first analog voltage through a first delay circuit and the second analog voltage through a second circuit, and an output circuit configured to provide a comparator output based upon whether values representing the first analog voltage or the second analog voltage propagated faster through the first digital delay line. In combination with any of the above embodiments, the comparator output may be configured to identify whether the first analog voltage or the second analog voltage is greater. In combination with any of the above embodiments, the voltage comparator may further include a voltage to current converter circuit. In combination with any of the above embodiments, the first digital delay line may be further configured to propagate the first analog voltage and the second analog voltage after the first analog voltage is converted to a first current and the second analog voltage is converted to a second current. In combination with any of the above embodiments, the output circuit is further configured to provide the comparator output based upon whether the first current or the second current is greater. In combination with any of the above embodiments, the output circuit is further configured to identify that the first analog voltage is greater than the second analog voltage based on a determination that the first current is greater than the second current. In combination with any of the above embodiments, the output circuit is further configured to identify that the first analog voltage is greater than the second analog voltage based on a determination that the values representing the first analog voltage propagated through the first digital delay line faster than those of the second analog voltage. In combination with any of the above embodiments, the voltage comparator may further include a second digital delay line and a multiplexer. In combination with any of the above embodiments, the first and second digital delay lines may be configured to alternatively compare analog voltage inputs.

In combination with any of the above embodiments, the comparator may further include a thermometer code logic circuit configured to interpret values representing the first analog voltage and the second analog voltage into a comparison identification for the output circuit. In combination with any of the above embodiments, the comparator may further include a transconductor configured to convert an input differential voltage between the first analog voltage and the second analog voltage into a differential current representing the first analog voltage and the second analog voltage.

In combination with any of the above embodiments, each differential digital delay line may include a chain of current limited buffers.

In combination with any of the above embodiments, a given differential digital delay line may be configured to operate at a speed according to a differential current applied to the given differential digital delay line. In combination with any of the above embodiments, the comparator may further include a latch configured to save data from a slower differential digital delay line upon a completion of faster differential digital delay line.

Embodiments of the present disclosure may include a microcontroller, including a plurality of voltage comparators implemented to any of the embodiments described above.

Embodiments of the present disclosure may include methods performed by any of the comparators or microcontrollers described above.

DETAILED DESCRIPTION

FIG. 1 illustrates an example over range protection variable resolution differential delay line ADC 100, according to embodiments of the present disclosure. ADC 100 may be used in, for example, comparators.

ADC 100 may be implemented as a digital delay line (DDL) ADC. Through implementation as a digital delay line ADC, ADC 100 may perform its measurements at a lower cost and less power than conventional flash ADCs. In one embodiment, ADC 100 may include background calibration. In another embodiment, ADC 100 may include range adjustment. In yet another embodiment, ADC 100 may estimate how far out of a desired range that its analog input would be measured. When the error voltage of ADC 100 goes out of range, it can be difficult for control loops using ADC 100 to re-acquire a lock. The out of range estimate created by ADC 100 provides the direction, and a qualitative estimate of the error, so that an algorithm can make necessary adjustment. Even if the estimate is outside the accurate range of the ADC, a qualitative estimate of just how far outside the accurate range the estimate is may allow better action and performance. In various embodiments, a determination that an analog input is out of range may be used as a comparison evaluation between inputs to ADC 100.

ADC 100 may be implemented largely with digital, low voltage logic. Accordingly, ADC 100 may be small with respect to footprint or die size. Furthermore, ADC 100 may thus require low power. Also, ADC 100 may thus operate very fast. Accordingly, ADC 100 may be used as a comparator, even when multiple instances of ADC 100 may be combined to create a practical implementation of such a comparator.

Background calibration may improve ADC 100 performance with regards to key metrics such as resolution and accuracy. Range adjustment may make usage of ADC 100 as a comparator more flexible and adaptable to system needs for whatever system ADC 100 is implemented. Out of range estimation may provide useful information when ADC 100 is out of its linear range (with respect to its input). Furthermore, ADC 100 may specify as part of the estimation a qualitative or quantitative magnitude and sign or direction of the out-of-range input. In one embodiment, such a qualitative or quantitative magnitude and sign or direction of the out-of-range input may be used to generate a result of comparison between two inputs. This may give effect to the ability of ADC 100 to act as a comparator.

Figure 2:
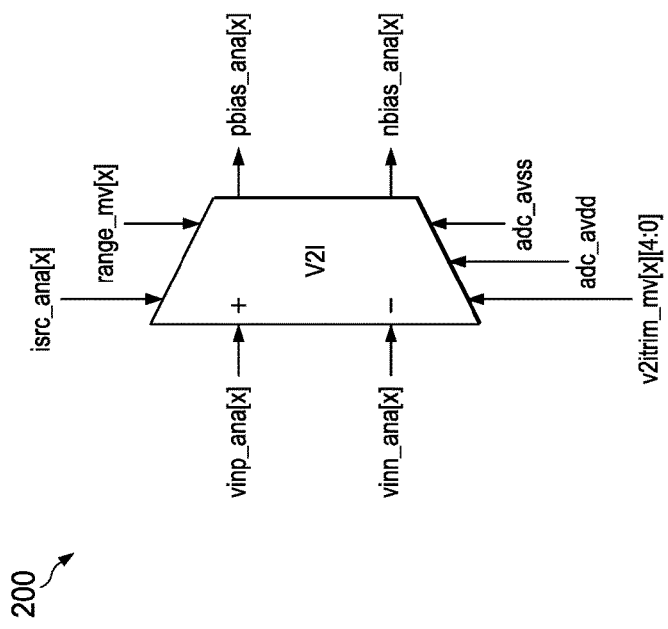
FIG. 2 illustrates a representation of an input circuit, according to embodiments of the present disclosure.

By implementing ADC 100 as a delay line ADC, ADC 100 may convert a differential voltage into differential currents. FIG. 2 illustrates a representation of an input circuit 200, according to embodiments of the present disclosure. Input circuit 200 may interface with ADC 100 or may be implemented as part of ADC 100. Input circuit 200 may be configured to convert the differential voltage between an input voltage and a reference voltage into a current. In particular, input circuit 200 may convert the differential voltage into a pbias and an nbias current. Input circuit 200 may be implemented by a set of transistors. The difference between the differential currents is related to the differential between the input voltage and the reference voltage. One of the pbias or nbias current will be stronger than the other. Moreover, one of the pbias or nbias currents will be stronger than the other to a degree that the input voltage or the reference voltage was higher.

Returning to FIG. 1, the outputs of pbias current and nbias current from input circuit 200 may be applied as inputs 102, 104. ADC 100 may function with a data delay line through current starved buffers 116, 118. Each element of buffers 116, 118 may activate to propagate its input when current from respective nbias 102, pbias 104 current reaches the element. The buffer state might initially be all zeroes, and the convert signal 106 that is to be propagated may be a one. In other cases, the buffer state might initially be all ones, and the convert signal 106 that is to be propagated may be a zero. Pbias 104 current and nbias 102 current reach respective elements of buffers 118, 116, and such elements in turn activate to propagate to the next such element in the buffer chain when the respective current is received. Consequently, the buffer associated with the larger, and thus faster, current of nbias 102 or pbias 104 currents may fill up first. The buffer may fill up with the propagated value from convert signal 106 (originally applied to both buffers). The other buffer might not fill all the way up, but may fill up according to the relative speed (and thus size) of its current. In one embodiment, ADC 100 may identify which of buffers 116, 118 was completed first. Furthermore, ADC 100 may examine, upon completion of one of buffers 116, 118, the status of the incomplete buffer of buffers 116, 118. Based upon the number of filled elements within the partially filled buffer, the relative difference between nbias 104 and pbias 102 may be ascertained. Based upon this relative difference, the difference between the input voltage and the reference voltage may be ascertained. The difference between the input voltage and the reference voltage may be interpreted as a comparison between the voltages, giving effect to ADC 100 as a comparator. Buffers 116, 118 may be referred to as current starved buffers in that the buffer is waiting to activate until current is received from pbias 102 or nbias 104. Buffers 116, 118 may activate successively with a speed related to the size of the respective differential currents which are in turn related to the respective differential voltages that generated the differential currents.

ADC 100 may be configured to represent the difference in speeds between pbias 102 and nbias 104 through the relative speeds of each buffer 116, 118 through a thermometer code. The code may be stored in latches 112. Latches 112 may store the thermometer code as a snapshot of buffers 116, 118 upon completion of the first of pbias 102 and nbias 104. Upon completion of the first of pbias 102 or nbias 102, the respective buffer of buffers 116, 118 may output its signal that, instead of propagating to the next delay element, may become done+ or done−, respectively. Done+ may represent that buffer 116 has finished propagating (due to pbias 102), and done− may represent that buffer 118 has finished propagating (due to nbias 104). An OR gate may combine done+ and done− to generate a done signal. The done signal may be fed as a control to set the values of latches 112. Thus, latches 112 may accept its values when the done signal is generated, which would be upon the completion of the first of buffers 116, 118. The one of done+ and done− that is set or completed may be saved as a sign, indicating the sign of the differential. The sign may be represented by whichever of psign and nsign is set. Latches 112 may also be set or reset according to whether the convert signal has been issued.

At the time at which the values of latches 112 are to be set (because nbias 102 or pbias 104 has finished passing through its respective buffer), the present values of buffers 116, 118 may be loaded into latches 112. In one embodiment, a modified version of the values may be loaded into latches 112. For example, the values from corresponding elements of buffers 116, 118 may be passed together through a NAND gate before the result is stored in a corresponding element of latches 112. As a result, latches 112 may store a string of ones followed by a string of zeroes, and the location at which the ones switch to zeroes may represent the location at which the slower of pbias 102 or nbias 104 reached in its respective buffer when the faster of pbias 102 or nbias 104 reached the end of its respective buffer and generated a done signal. The thermometer code showing this location of the slower of pbias 102 or nbias 104 may be converted by a shift register, multiplier, or other algorithmic circuit in thermometer to binary converter 114. The resulting data 126 may be used to show the relative difference between pbias 102 and nbias 104. The difference in the voltage that generated pbias 102 and nbias 104 may then be inferred from the resulting data 126. In some embodiments, such as in voltage regulators, this difference may be the difference between actual output voltage of the regulator and the desired level of output voltage of the regulator.

ADC 100 includes buffers 116, 118 implemented with digital cells. Accordingly, ADC 100 may have a small footprint or die requirement as well as low power. ADC 100 may thus be faster than other ADCs. Moreover, using DDL buffers, ADC 100 may be faster and smaller than other implementations. In contrast, an ADC implemented as a conventional flash ADC might be fast, but in current submicron technology nodes may be large and consume significant current. A delay line ADC such as ADC 100 may be comparatively much smaller and lower power.

In one embodiment, ADC 100 may include delay elements to perform out-of-range estimation. Each of buffers 116, 118 may include p delay elements. The p delay elements may be sufficient for ADC 100 to implement a ADC conversion with a resolution of q bits. The conversion of voltage differential to a binary data 126 may be performed with n delay elements. The thermometer code may be n bits wide. However, there may be additional delay elements included in each of buffers 116, 118 before such n delay elements that are actually used for voltage differential calculation. There may be any suitable number of such delay elements, such as 1 up to m such delay elements. The output of these additional delay elements may be output as overflow 120. These extra delay elements and resulting bits at the beginning of respective buffers 116, 118 may be included in ADC 100 so that the transconductor of the voltage-to-current converter of FIG. 2 and that the n delay cells of ADC 100 may operate within linear regions. Without inclusion of the m delay cells, the speed of the current through the n delay cells might not be precisely proportional to the current differential generated by the voltage-to-current converter.

In one embodiment, ADC 100 may capture the output of them delay cells as overflow 120. Overflow 120 may be used to generate an estimate of the voltage value of the vsense when it is out of range with respect to the current settings. The estimate may be used by part of the system in which ADC 100 is implemented to take corrective action. The corrective action may include changing an input range for ADC 100, changing the reference voltage, or other suitable action.

For example, the input range of ADC 100 may be 200 millivolts. If the reference voltage is 1.0 V, and the sensed voltage is 1.4 V, ADC 100 may produce a thermometer code corresponding to a voltage difference of 0.2 V. However, the maximum differential that can be represented given the resolution of ADC 100 is 0.2 V. Accordingly, ADC 100 may report that the differential between the sensed voltage and the reference voltage is 0.2 V. However, a consumer of such information may recognize that the differential value is the maximum value reportable by ADC 100, and thus it is likely that the actual differential is greater than the reported value.

ADC 100 may provide overflow 120. A consumer of the output of ADC 100 may utilize overflow 120 when the output of ADC 100 indicates a maximum voltage differential of inputs of ADC 100. In one embodiment, overflow 120 may be reused from existing delays of an ADC 100 from portions of buffers 116, 118 that are not used to represent voltage differential from the range of input values of ADC 100. As discussed above, overflow 120 may be reused from delays that are used to linearize thermometer code with the current differential.

In one embodiment, when data 126 is a maximum or minimum value (wherein the maximum versus minimum nature is specified by the sign of data 126) overflow 120 may be evaluated qualitatively. Such an evaluation may be because of the non-linear range of the transconductor or delay cell.

In one embodiment, ADC 100 may be configured to perform range adjustment. Input ranges for ADC 100 may be designed, for example, to have a +/−200 mV or +/−400 mV range. The range may be selectable. In a further embodiment, ADC 100 may select one of the available ranges (such as +/−200 mV or +/−400 mV) based upon prior outputs of data 126. For example, if data 126 indicates a maximum differential and the input range is selected as +/−200 mV, then the input range may be changed to +/−400 mV. In another example, if data 126 indicates that the voltage differential is less than half of the available input range and the input range is +/−400 mV, then the input range may be changed to +/−200 mV. The narrower range might be used to increase effective resolution while a same number of bits are used. The wider range might be used initially to find an initial error voltage and then as SMPS control loops bring measured and reference voltages to a closer level, the range may be decreased.

In one embodiment, ADC 100 may be configured to perform calibration. For example, calibration might be performed by adjusting the current to individual ones of pbias 102 or nbias 104. In another example, calibration might be performed by adjusting the current to both of pbias 102 and nbias 104. Adjusting the current may adjust the speed or offset of pbias 102 or nbias 104. The current may be adjusted according to a calibration line in the overflow. For example, if the overflow indicates that the differential is great, the current in a current source circuit may be adjusted up or down according to a sign of the differential.

In another embodiment, ADC 100 may be configured to perform calibration by adjusting the length of delay lines 116, 118. The length of delay lines 116, 118 may be effectively adjusted by adding enable elements such as multiplexers to selectively eliminate usage of some of the delays in delay lines 116, 118.

ADC 100 may be implemented within any suitable chip, system-on-a-chip, semiconductor device, package, board, processor, or microcontroller, which may utilize ADC 100. Such entities may include a processor and a machine-readable medium such as memory including instructions that will perform operations that use ADC 100. Operation of ADC 100 may be made without having to use interrupt service routines (ISRs), as would be used by a conventional ADC. Moreover, there might be no need for direct memory access (DMA) to utilize ADC 100, as would be the case when a conventional ADC used. Seven instances of ADC 100 might be smaller than a 15 ns comparator, and as fast as an analog comparator.

Figure 3:
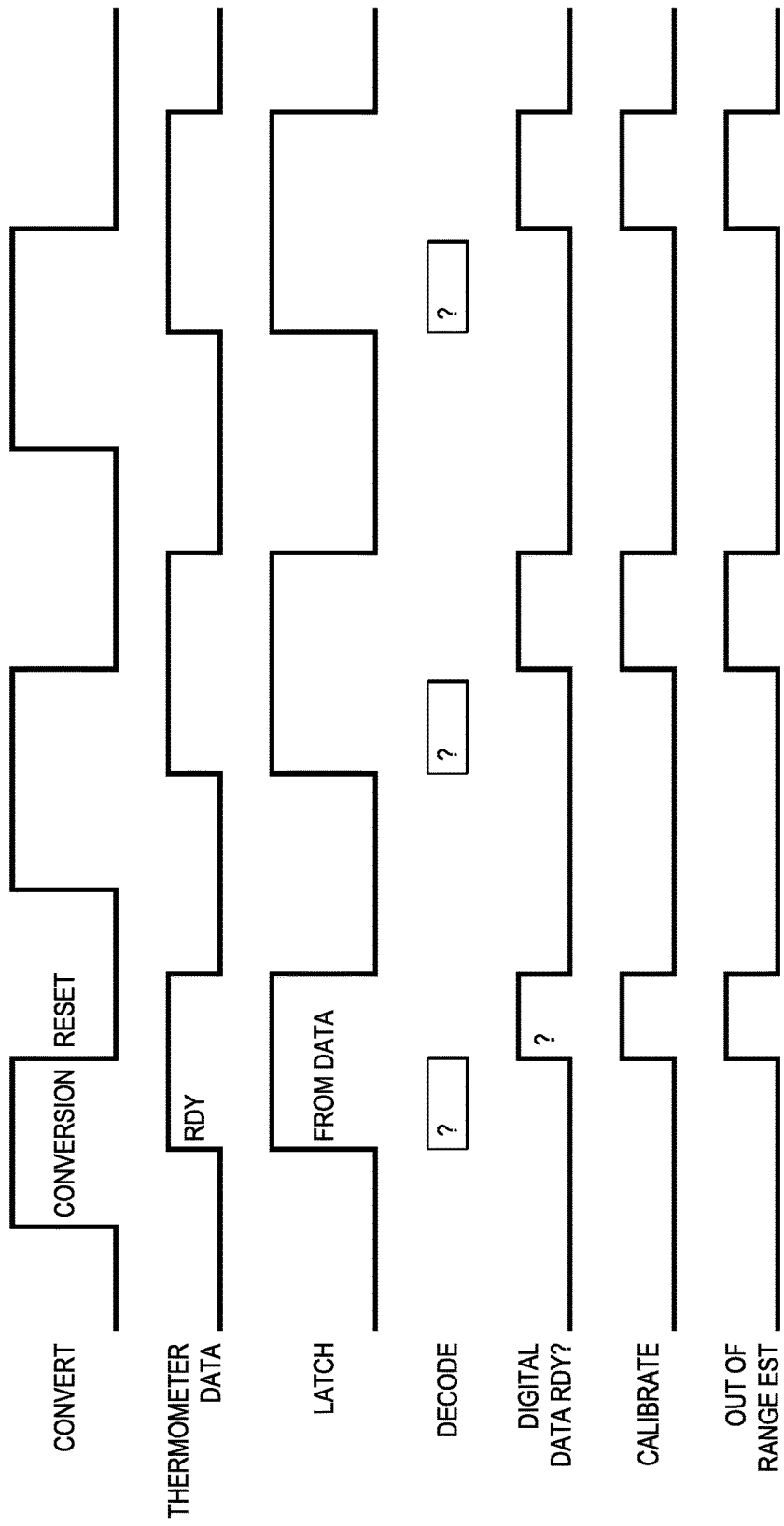
FIG. 3 illustrates a timing diagram of operation of an ADC, according to embodiments of the present disclosure.

FIG. 3 illustrates a timing diagram of operation of ADC 100, according to embodiments of the present disclosure. As show, a convert signal may start an analog to digital conversion. Clearing the convert signal may act as a reset. Upon finishing of one of the first of the nbias or pbias signal, the associated delay line will finish. Accordingly, the latch signal will be triggered and the associated thermometer code will be latched. The thermometer code may be decoded to a digital value during a time of suitable length. When the convert signal goes low again, the delay lines may be reset. If necessary, calibration and out-of-range estimations may be applied.

Figure 4:
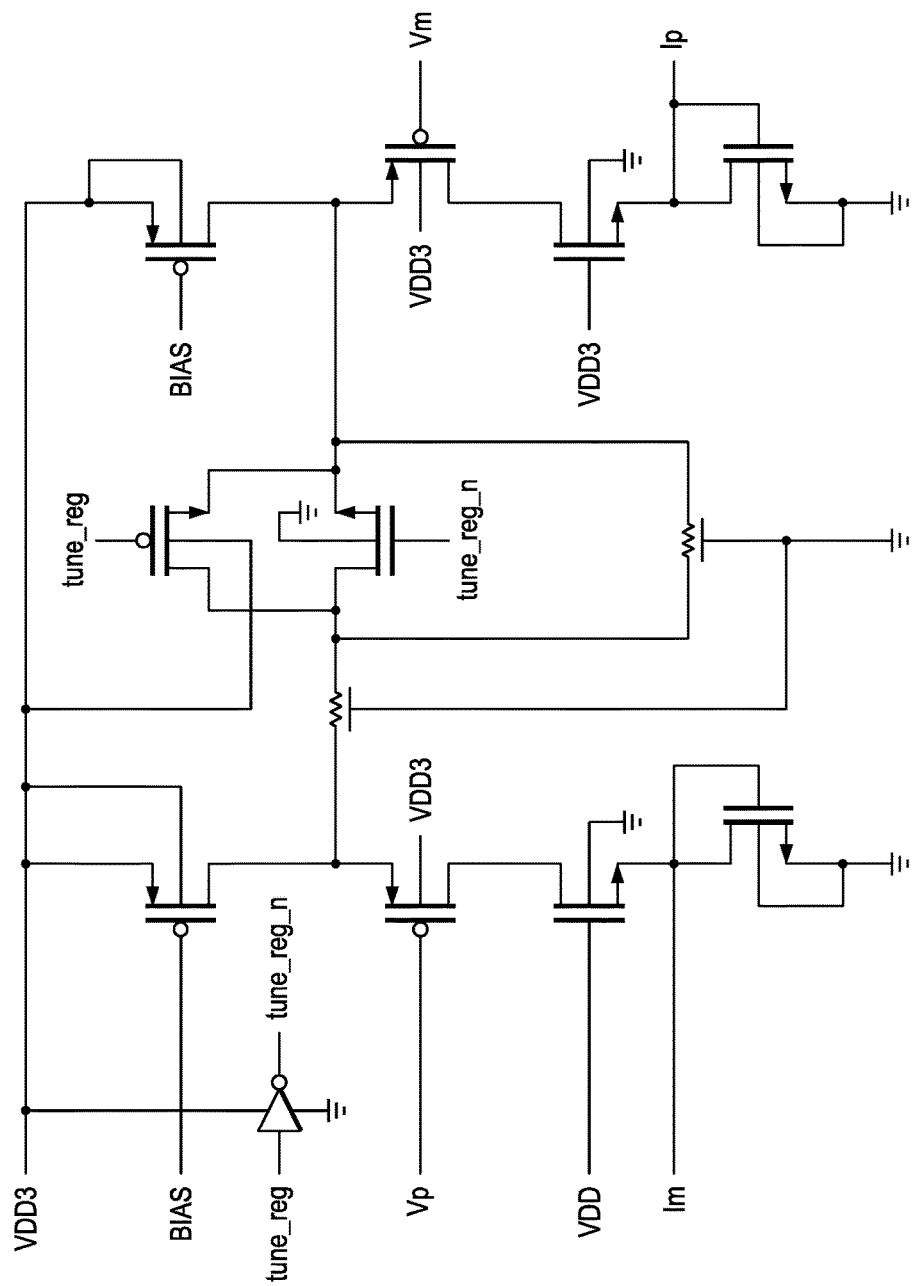
FIG. 4 illustrates an example front end, according to embodiments of the present disclosure.

FIG. 4 illustrates an example front end, according to embodiments of the present disclosure. The front end may include an implementation of the voltage to current converter shown in FIG. 2. The front end may be implemented in part with a transconductor. The transconductor may convert differential voltage into differential current and the range selection is done by adjusting its impedance value $R_s$. The transconductor may be defined according to its transconductance $g_m$, which may be given according to the differential current output divided by the differential voltage input. The overall output current of the front end may be given by:

$$I = \frac{g_{m1}}{1 + g_{m1}\frac{R_s}{2}} \Delta v_o$$

The impedance of the front end may thus be adjusted in order to adjust the output current.

Figure 5:
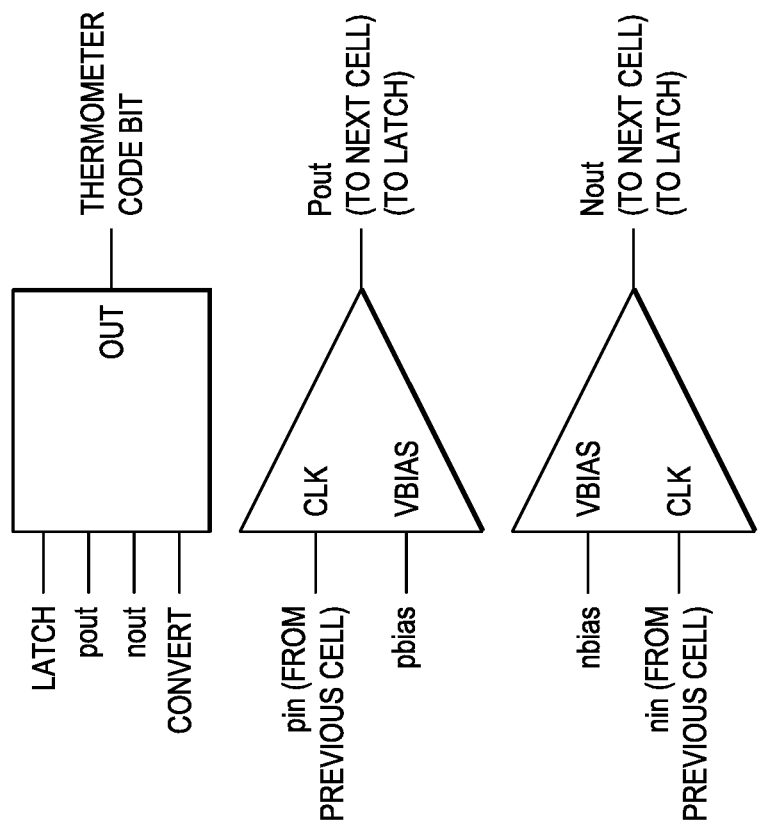
FIG. 5 illustrates example delay cells, according to embodiments of the present disclosure.

FIG. 5 illustrates example delay cells, according to embodiments of the present disclosure. Two corresponding delay cells and an associated portion of a latch are illustrated. The three may be implemented as a stack in order to create, in essence, a triple-height row or stack for a combined element. In each delay cell, output from the previous cell may be routed to a clock signal input and the pbias or nbias signal may be routed to a bias input. Once both inputs are high, the output may be routed to the next element.

Figure 6:
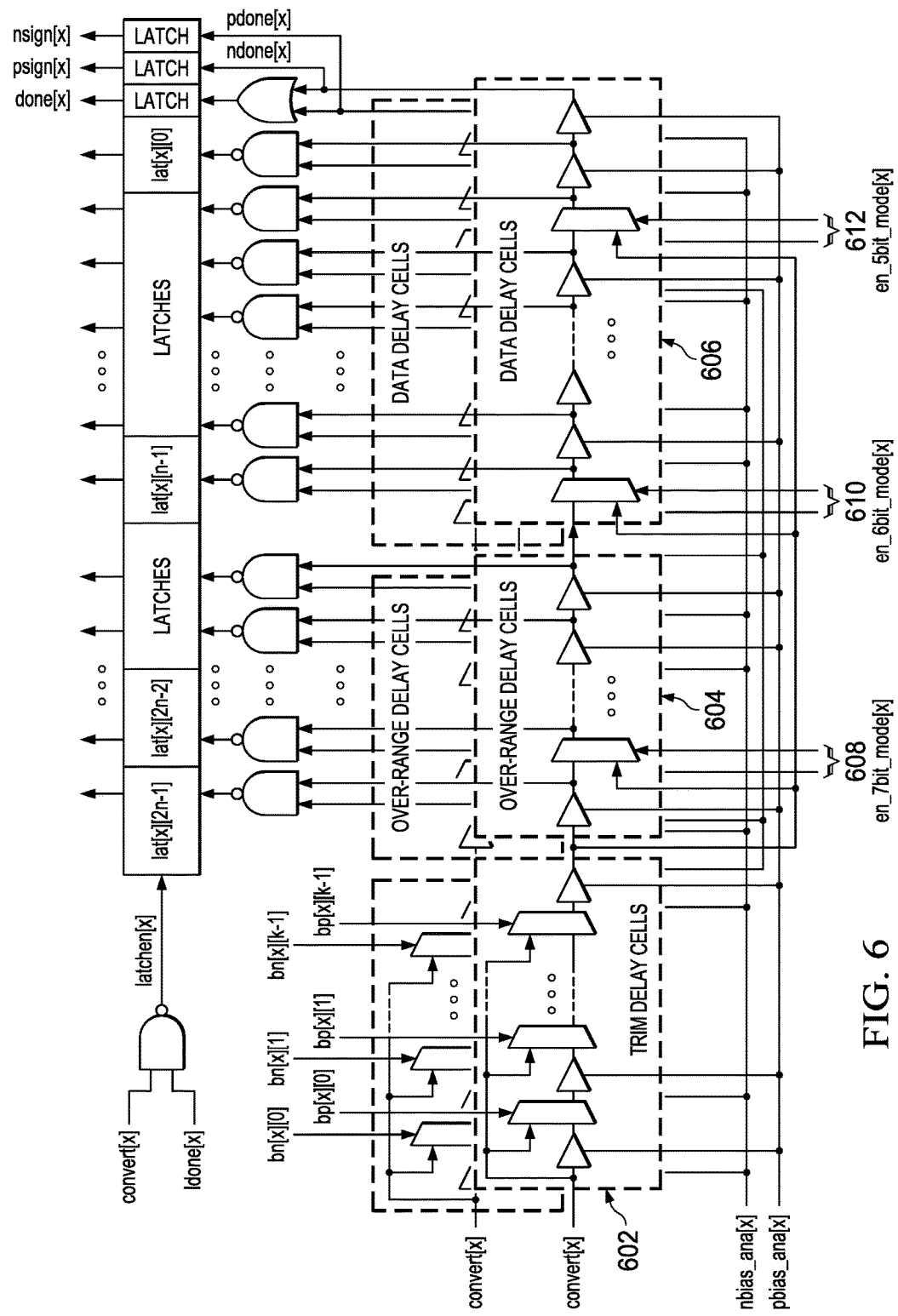
FIG. 6 is a more detailed view of ADC, according to embodiments of the present disclosure.

FIG. 6 is a more detailed view of ADC 100, according to embodiments of the present disclosure. As shown in FIG. 6, in various embodiments delay lines 116, 118 may be divided into optionally trimmed delay cells 602, over-range delay cells 604, and data delay cells 606. In some embodiments, one of trimmed delay cells 602 and over-range delay cells 604 may be omitted. Furthermore, one or more of these groups of cells may be divided into cell ranges according to desired precision of ADC 100. In one embodiment, data delay cells 606 may be divided into cell ranges according to desired precision. In another embodiment, data delay cells 606 and over-range delay cells 604 may be divided into cell ranges according to desired precision.

For example, some of the delay cells may be grouped into the number of data cells needed to support 5-bit precision for ADC 100 with a multiplexer 612. In another example, some of the delay cells may be grouped into the number of data cells needed to support 6-bit precision for ADC 100 with a multiplexer 610, or into 7-bit precision for ADC 100 with a multiplexer 608. Each such multiplexer may enable delay operation for the delay cells within the delay lines that follow the multiplexer. Thus, portions of the delay lines may be selectively activated according to a precision mode. The precision mode may be set according to a desired mode of ADC 100, user or software operation, or dynamically by ADC 100 in response to over-voltage or under-voltage situations. Enablement of 5-bit precision may enable all subsequent delay cells until the done signal generation. Similarly, enablement of 6-bit prevision may enable all subsequent delay cells until the done signal generation. The enablement of 5-bit precision delay cells may be performed. Similarly, enablement of 7-bit prevision may enable all subsequent delay cells until the done signal generation. The enablement of 5-bit and 6-bit precision delay cells may be performed.

Accordingly, there may be overlap between some of groups 604 and 606 in different cases and at different times. Cells not used for over-range might be used for regular data. Similarly, cells not used for data might be used for over-range. Moreover, the configuration of optionally trimmed delay cells 602 may be applied to elements of groups 604 or 606. While bit groupings may be accomplished with a multiplexer applied to an entire group, within a given such bit grouping, individual multiplexers may be applied to trim portions thereof.

In group 602, individual multiplexers for delay cells may trim or omit use in propagation lines. In some cases, the multiplexer operation for delay cells in the nbias delay line might differ from corresponding delay cells in the pbias delay line. Accordingly, the length of the delay lines might be adjusted so as to compensate for offsets, such that one of the pbias or nbias lines does not go through as many delay elements as the other delay line. The multiplexers for trimming the pbias lines may be controlled through the indexed commands of bp, and multiplexers for trimming the nbias lines may be controlled through the indexed commands of bn. Trimming the delay line may calibrate the respective current values.

Figure 7:
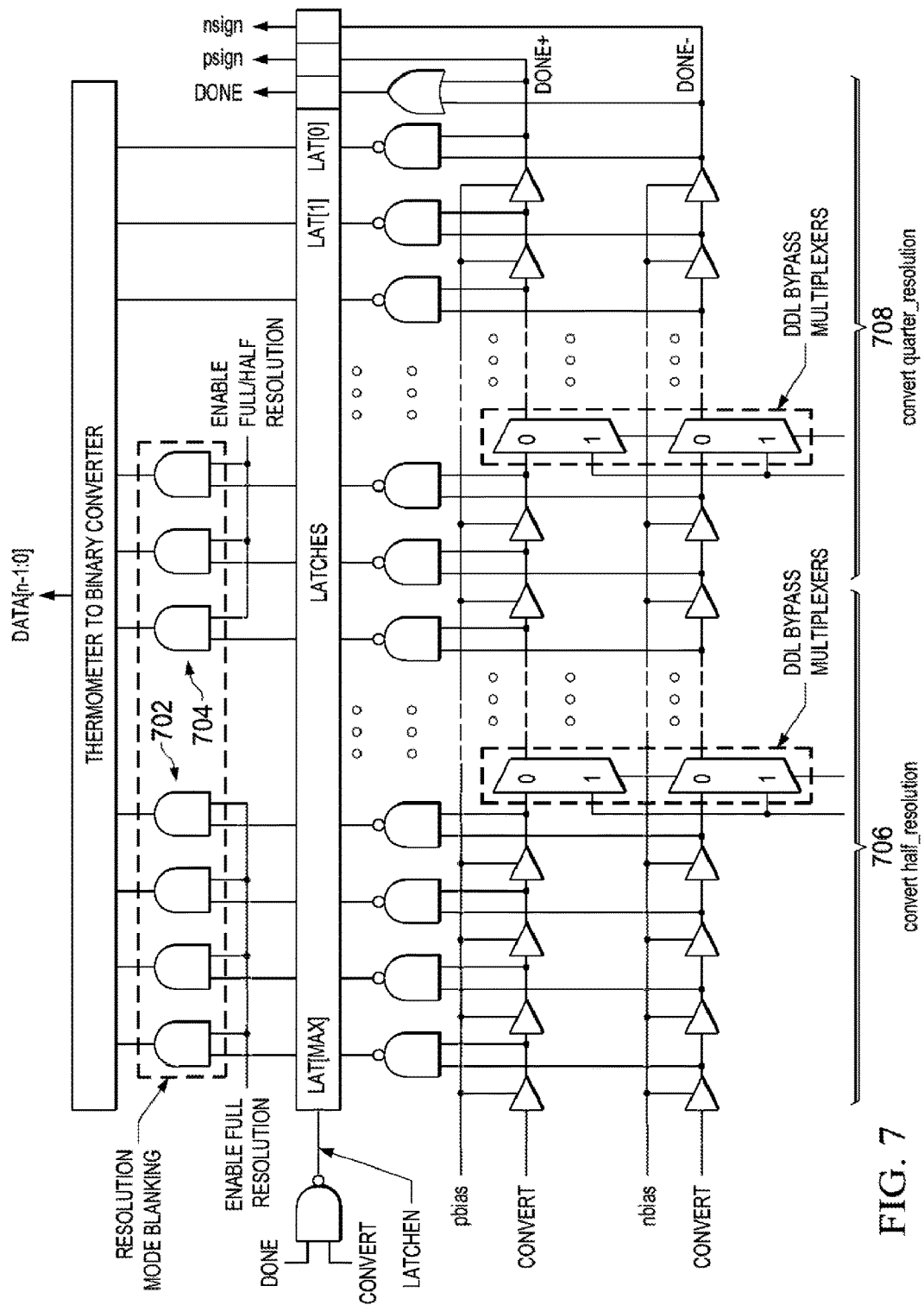
FIG. 7 is another, more detailed view of an ADC, according to embodiments of the present disclosure.

FIG. 7 is another, more detailed view of ADC 100, according to embodiments of the present disclosure. Illustrated are multiplexers 706, 708. Multiplexers 706, 708 may serve a similar purpose to multiplexers 610, 612. Multiplexer 610 may be placed at the 50% point from the DDL end. Multiplexer 612 may be placed at the 25% point from the DDL end. Other multiplexers, not shown, may be placed, for example, at the 12.5% point from the DDL end.

ADC 100 may include digital logic blocks, such as block 702 and block 704, to load data from the latches. The enable signals for the digital logic blocks may be tied to the multiplexer enablement. For example, when multiplexers 706, 708 are to enable full resolution, blocks 702 and 704 may allow loading of all data from the latches. When multiplexers 706, 708 are to enable half resolution, block 702 may be turned off while block 704 is turned on. Other logic blocks for quarter resolution and so forth are not shown. Such blocks also be used in coordination with the multiplexers of FIG. 6.

Each multiplexer closer to the end reduces the resolution by 1-bit but doubles the speed of conversion when shutting down part of delay lines of ADC 100. The AND gates of the logic blocks between the data latches and the thermometer to binary code converter select the applicable inputs for differing resolution selections. Such logic blocks might be implemented instead between the delay lines and the latches.

By use of the logic blocks, the "ones" in unused delay line taps are prevented from corrupting data results. Multiplexers placed in the delay lines might also provide a mechanism to insert a reset value into multiple points in the delay to yield a faster reset following a conversion cycle. This may reduce the time delay to when the next conversion can begin.

Figure 8:
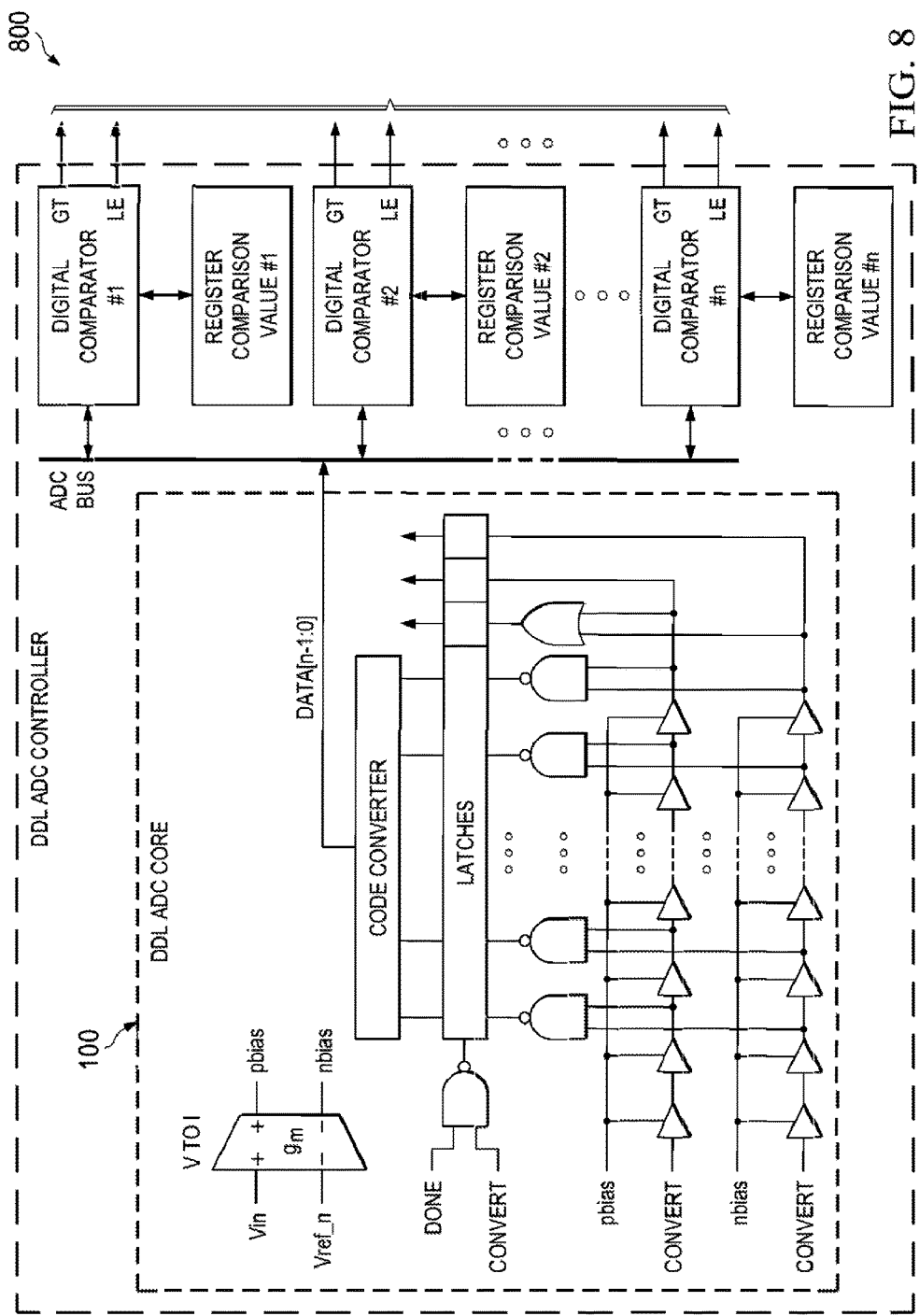
FIG. 8 is an illustration of a microcontroller with an ADC featuring digital comparators for controlling PWM, according to embodiments of the present disclosure.

FIG. 8 is an illustration of a microcontroller 800 with a DDL ADC featuring digital comparators, according to embodiments of the present disclosure. The DDL ADC may be implemented using any of the ADCs of the present disclosure, though ADC 100 is used as example.

In other applications, pure analog comparators might be used, for example, to monitor power applications, wherein a pulsed-width-modulation (PWM) power source continually generates an on-off signal with a duty cycle that sets a power source output. The output is continually monitored and the duty cycle adjusted as necessary. However, using analog comparators might be limited to a single output, but yet might be fast. In other applications, ADCs incorporate digital comparators to detect out of range operation and generate interrupts to a processor so software can make adjustments to the PWM. ADCs can provide multiple bits of output to software but are slow relative to a power supply control loop.

By use of ADC 100, the microcontroller might take advantage of the very high speed of the ADC 100. Digital comparators and associated registers may monitor the ADC 100 data output and assert digital output signals when the data meets the comparison criteria. These output signals might be connected to a PWM circuit to provide immediate control (modification) of the PWM output signals.

Instances of ADC 100 may output their values to one or more PWM controllers or circuits. These may be routed through an ADC bus directly to one or more digital comparators. The digital comparators may be implemented in respective PWM controllers or circuits, or may be communicatively coupled thereto. The digital comparators may be programmed with register values or other indicators of which of ADC 100 signals are to be used for a given digital comparator. Thus, a digital comparator may be designated to subscribe or accept data from a given ADC 100. Furthermore, a value by which the digital comparator is to compare the ADC 100 signal may be specified in the register. A PWM controller may issue PWM signals based upon whether the differential voltage is greater than a threshold specified in the comparison value register. Moreover, different levels may be specified in the different comparison value registers. A PWM controller may issue PWM signals based upon which thresholds that the differential voltage reaches.

The digital comparators may each have two outputs, a first output indicating that the value is greater than a value stored in an associated register and a second output indicating that the value is less or equal than the value stored in the associated register. The comparators according to other embodiments may have different outputs indicating using different operators such as equal, greater, less, greater or equal, less or equal, etc. The output signals provided by the comparators can be used to control the PWM module directly. This design does not need to wait for interrupt service routines and there is no need for DMA transfers.

Figure 9A:
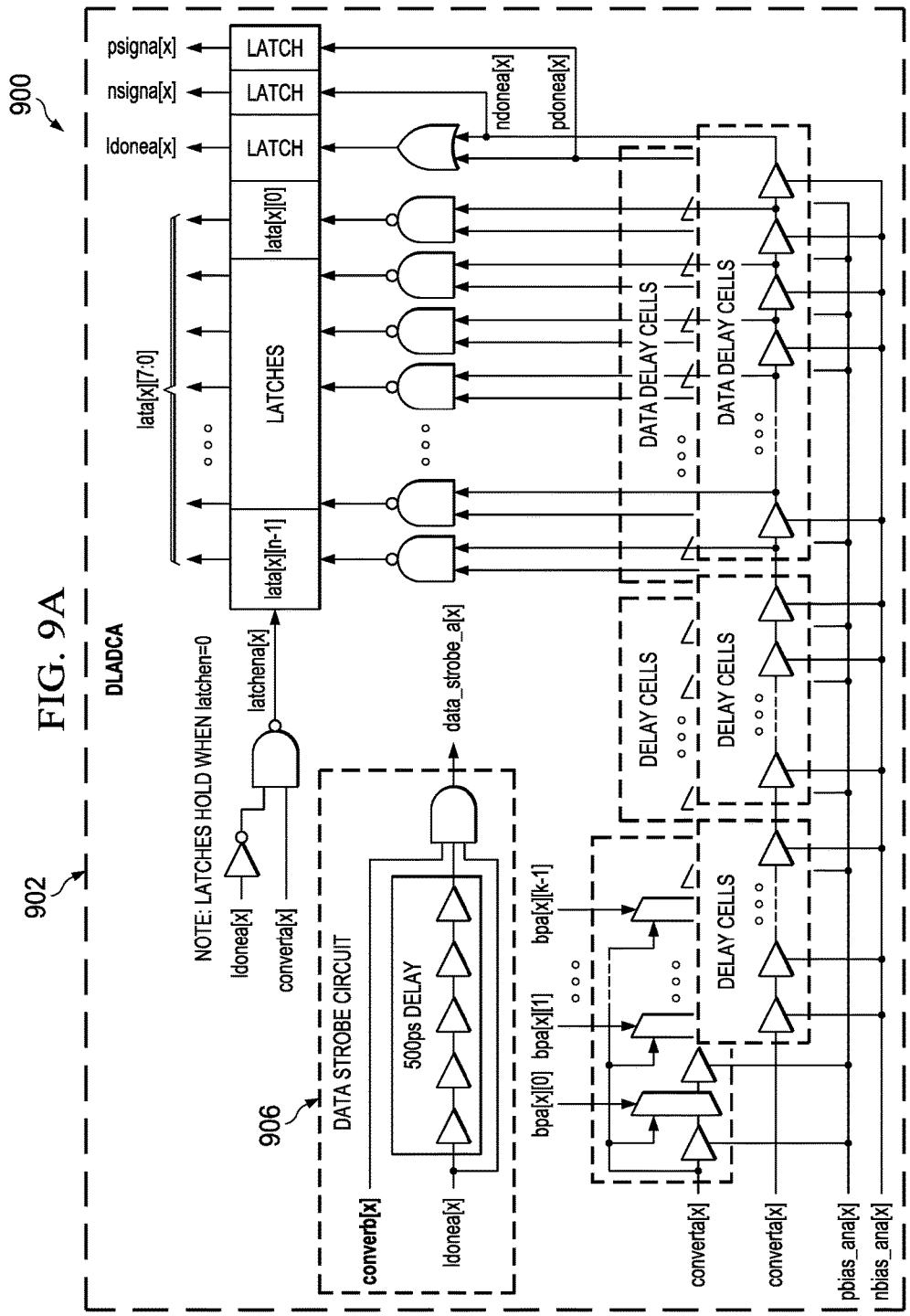
FIGS. 9A-9B are an illustration of an example comparator using DDL ADCs, according to embodiments of the present disclosure.
Figure 9B:
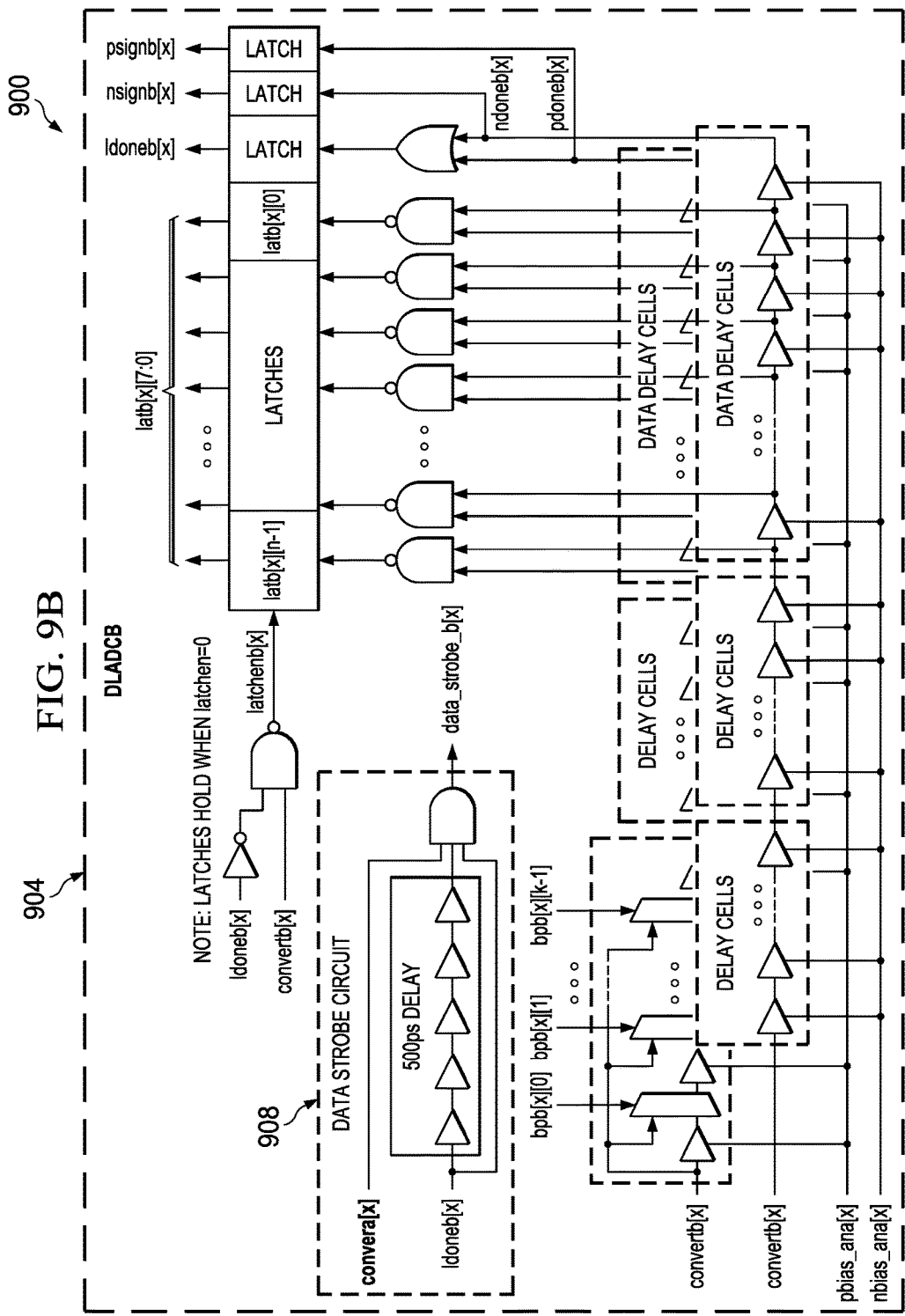

FIGS. 9A-9B are an illustration of an example comparator 900 using DDL ADCs, according to embodiments of the present disclosure. The DDL ADCs may be implemented in part by ADC 100 or any of the embodiments of ADCs shown in FIGS. 1-8. Comparator 900 may be used in SMPS applications, wherein the SMPS controller needs to make fast peak current or voltage detections. Propagation delay may increase power supply output ripple while reducing power supply stability. Given the size of a DDL ADC, many comparators may be implemented in a small die space. In contrast, analog comparators are large, slow, and power hungry. Moreover, comparators cannot use system clocks due to safety concerns with clock failures. Thus, DDL ADCs may be used as a comparator.

Comparator 900 may include two interleaved DDL ADCs 902, 904. While comparator 900 could be implemented with a single such DDL ADC, two such DDL ADCs may be used so that one of the DDL ADCs operates while the other DDL ADC is resetting. In other embodiments, more than two such DDL ADCs could be used in a single comparator. The input and output control of comparator 900 is disclosed in further detail in conjunction with FIG. 10.

DDL ADCs 902, 904 may each include a data strobe circuit, denoted respectively as 906, 908. Data strobe circuit 906 may accept as input the done signal of DDL ADC 902 and a convert signal of DDL ADC 904. Data strobe circuit 906 may include delay elements sufficient to create, for example, a 500 picosecond delay for the done signal. The output of the delay—the delayed done signal—may be routed to an AND gate, which may combine inputs of the delayed done signal, the done signal of DDL ADC 902, and the convert signal of DDL ADC 904. The output of the AND gate may produce the data strobe signal of DDL ADC 902. Similarly, data strobe circuit 908 may accept as input the done signal of DDL ADC 904 and a convert signal of DDL ADC 902. Data strobe circuit 908 may include delay elements sufficient to create, for example, a 500 picosecond delay for the done signal. The output of the delay—the delayed done signal—may be routed to an AND gate, which may combine inputs of the delayed done signal, the done signal of DDL ADC 904, and the convert signal of DDL ADC 902. The output of the AND gate may produce the data strobe signal of DDL ADC 904.

The strobe signals of DDL ADCs 902, 904 may indicate that the data is valid in the associated vectors or arrays.

Figure 10:
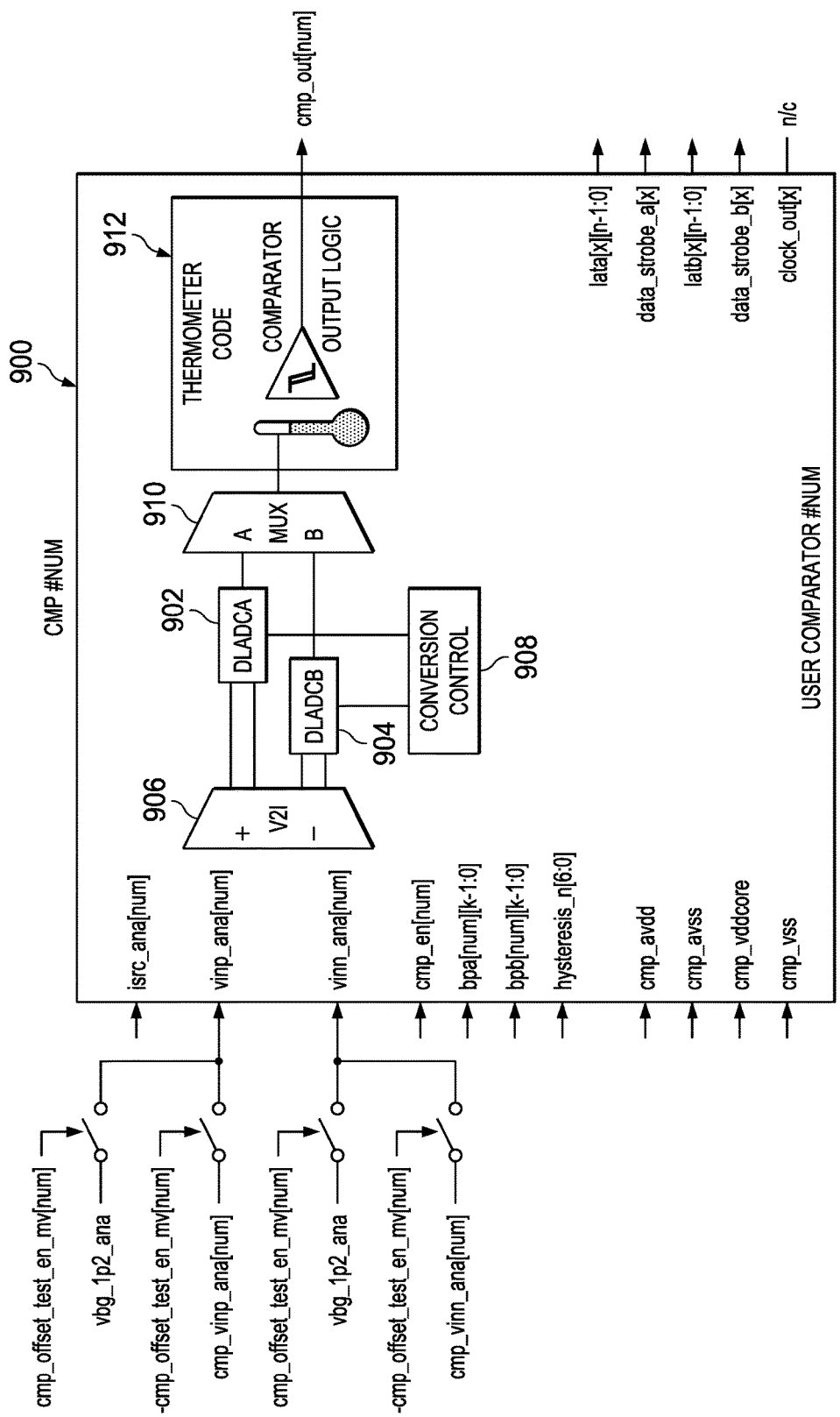
FIG. 10 is a more detailed illustration of an example comparator using DDL ADCs, according to embodiments of the present disclosure.

FIG. 10 is a more detailed illustration of an example comparator 900 using DDL ADCs, according to embodiments of the present disclosure. Comparator 900 may include two DDL ADCs 902 and 904, as discussed above. DDL ADCs 902 and 904 may operate in 180° phase with respect to each other, wherein one of DDL ADCs 902 and 904 is used for comparison operation in comparator 900 while the other of DDL ADCs 902 and 904 is reset or reconfigured. The output of DDL ADCs 902 and 904 may be routed to a multiplexer 910, which may select the appropriate one of these as output for comparator 900.

Comparator 900 may include a voltage to current converter 906. Converter 906 may be implemented as input circuit or voltage to current converter 200. The output of converter 906 may be routed to both of DDL ADCs 902, 904. In one embodiment, the output of converter 906 might not need multiplexing in distribution to both of DDL ADCs 902, 904.

Comparator 900 may include a conversion control circuit 908. Conversion control circuit 908 may be configured to determine when one of DDL ADCs 902, 904 has generated a comparison and then initiate, if requested, the other of DDL ADCs 902, 904 to begin a comparison. Conversion control circuit 908 may be configured to accept as input comparison enablement signals and done signals, and may be configured to assert convert signals. The convert signals may act as an enable for a given delay line circuit. The delay line circuit may begin processing upon assertion of the convert signal.

Comparator 900 may include thermometer code comparator output logic 912. Logic 912 may be configured to, given a done signal and data multiplexed from one of DDL ADCs 902, 904, interpret the data according to thermometer code and generate a comparison signal as an output.

Figure 11:
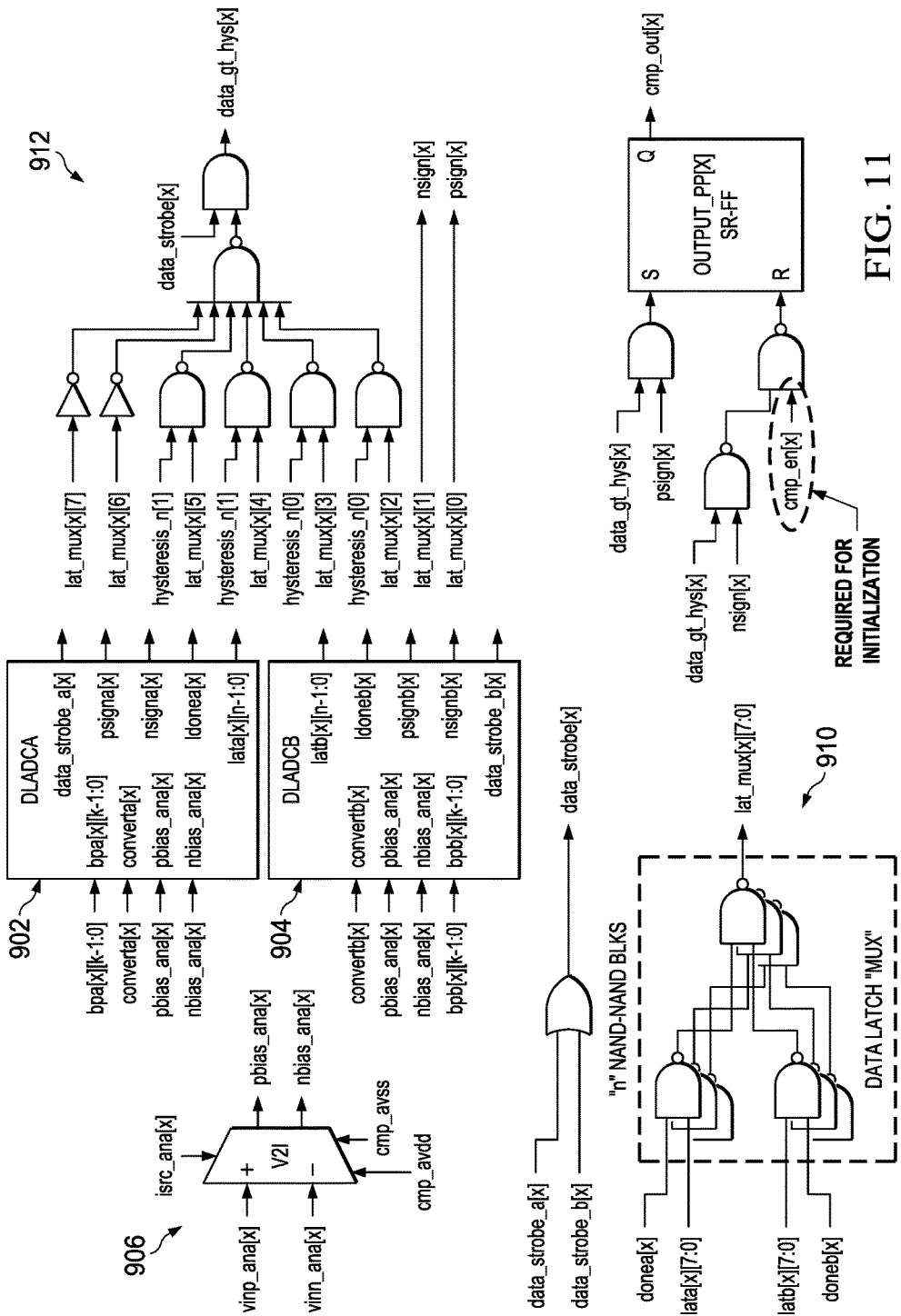
FIG. 11 illustrates elements of a comparator in more detail, according to embodiments of the present disclosure.

FIG. 11 illustrates elements of comparator 900 in more detail, according to embodiments of the present disclosure. Inputs and outputs of voltage to current converter 906 are shown, as are inputs and outputs of DDL ADCs 902, 904.

Inputs and outputs as well as example implementation of thermometer code comparator output logic 912 and multiplexer 910 are shown. If the data strobe of either of DDL ADCs 902, 904 is activated then the data strobe of comparator 900 may be activated. The done signals and data produced by DDL ADCs 902, 904 may be routed to multiplexer 910, which may produce a set of multiplexed data.

Logic 912 may generate a single output to show whether the voltage for the p-input was greater than or less than the voltage for the n-input. Logic 912 may take into account hysteresis, a magnitude of which may be received at comparator 900 as an input. The hysteresis may take into account noise that might otherwise cause flipping of the comparison. Debouncing may thus be eliminated unless a change between a previous reading is sufficiently high. If the voltage difference is not big enough, then a voltage difference may be ignored. The output may be latched with a flip-flop. If hysteresis has been overcome, then logic 912 may push the first-to-finish signal between nsign and psign as output.

A given system, chip, microcontroller, module, or other electronic element may include a series of comparators, each an instance of comparator 900. One such instance may be reserved for calibration.

For comparator 900, cmp_vdd core may supply core voltage for DDLs, decode logic, and other logic; cmp_vss may supply digital VSS for DDLs, decode logic, and other logic; cmp_vdda may supply analog VDD; and cmp_vssa may supply analog VSS.

Cmp_mod_en_mv may specify whether a given bank of comparators 900 is to be enabled, and cmp_en[num:0] may enable a specific comparator 900. Cmp_vinp_ana[num:0] may specify positive analog inputs for each comparator 900, and cmp_vinn_ana[num:0] may specify the negative analog inputs. Vbg_1p2_ana may provide an analog 1.2V reference voltage input, used for offset calibration and master current circuit operation. Bpa[num][k−1:0] and Bpb[num][k−1:0] may provide suitable levels of coarse or fine trimming of delay cells. Hysteresis_n[1:0] may specify hysteresis control inputs and the degree of change that must be overcome to flip output of comparator 900. These values may be specified in a thermometer code format (not binary encoded). The thermometer coded hysteresis value may be inverted (low active) prior to input. Cmp_out[num:0] may be the output of a comparator 900. The zeroth output may be reserved for internal calibration. Data_strobe_a[num:0] and data_strobe_b[num:0] may be data valid strobe for the associated lata[n:0] or latb[n:0]. Clock_out[num:0] may be an internally generated clock that follows the associated CONVERT_FF[x] S-R FF. Pbias_ana may be the bias current to control the delay of the "P" (positive) delay line (DDL) and nbias_ana Bias current to control the delay of the "N" (negative) delay line (DDL) of a given DDL ADC. Convert may be the conversion control signal, wherein a one signals conversion enable and a zero signals to clear a DDL string. Lat[7:0] may include a bus of signals including lat[0]=psign, lat[1]=nsign, lat[2]=cmp_pos5mv, lat[3]=cmp_neg5mv, lat[4]=cmp_pos20mv, lat[5]=cmp_pos40mv, lat[6]=cmp_neg20mv, and lat[7]=cmp_neg40mv. Done may signal an indication that conversion is completed. Data_strobe_a and data_strobe_b may include a data valid strobe for the associated lata[7:0] or latb[7:0]. Isrc_ana[num:0] may be a bias current input to the individual V2I converters. Vinp_ana may be a positive analog input and vinn_ana may be negative analog input. Pbias_ana may be an output bias current to control the delay of the "P" (positive) delay line (DDL) and nbias_ana may be an output bias current to control the delay of the "N" (negative) delay line (DDL).

In operation, comparator 900 may thus use two time-interleaved DDL ADCs providing near continuous input signal monitoring. The various embodiments also provide very high speed operation, such as 1.6 ns. The various embodiments can be quite small, wherein four comparators require 31 sq. mils. Furthermore, the various embodiments are low power, using as little as 2 mW. The various embodiments include user selectable digital hysteresis. The various embodiments are self-timed, and therefore do not need external system clocks. Each comparator may include two 3-bit DDL ADCs that are time interleaved, one converts while the other resets prior to next conversion. The ADC sign outputs determine comparator output. The ADC data output is compared to specified hysteresis value. If the data is less than hysteresis, the comparator output does not change. The circuit for each comparator is self-timed: when one ADC output is ready, the other ADC begins next conversion. The conversion process starts with both delay chains set to zero. The bias supply currents for each delay chain is provided by a differential input voltage to differential output current converter. One current supplies the "positive" delay chain, the other supplies the "negative" delay chain. When the convert signal is asserted, a logical "1" is flows from the input to the end of the two delay chains. The ones race each other to the end, the speed of each delay chain is controlled by the current supplied by the voltage to current converter. The chain with its stages set to "1" had the larger current and thus the larger starting voltage. The edge detectors monitor the progress of the "1" s that propagate to the end of the delay lines. The edge detectors latch the results of the race between the two delay lines. The edge detector monitoring the outputs of the output of the delay lines generates the "psign" and "nsign" signals. These sign bits are latched in the edge detectors. The "psign" and "nsign" latched sign bits are used to create the high/low comparator output signal. Following a conversion cycle, the delay line chains must be cleared to zero. The clearing or resetting operation is done by de-asserting the convert signal and waiting for the zeros to propagate through the delay chains. Each comparator is composed of two delay line sub-assemblies that are run in an interleaved fashion. When one DDL is converting, the other is resetting to an all zeros state, getting ready for the next conversion. Each comparator has its own self timed control circuitry. The CONVERT_FF in the control logic will toggle at approximately 375 MHz according to an embodiment. The time is based on the path delay of the associated delay chains in the two DDLs.

Figure 12:
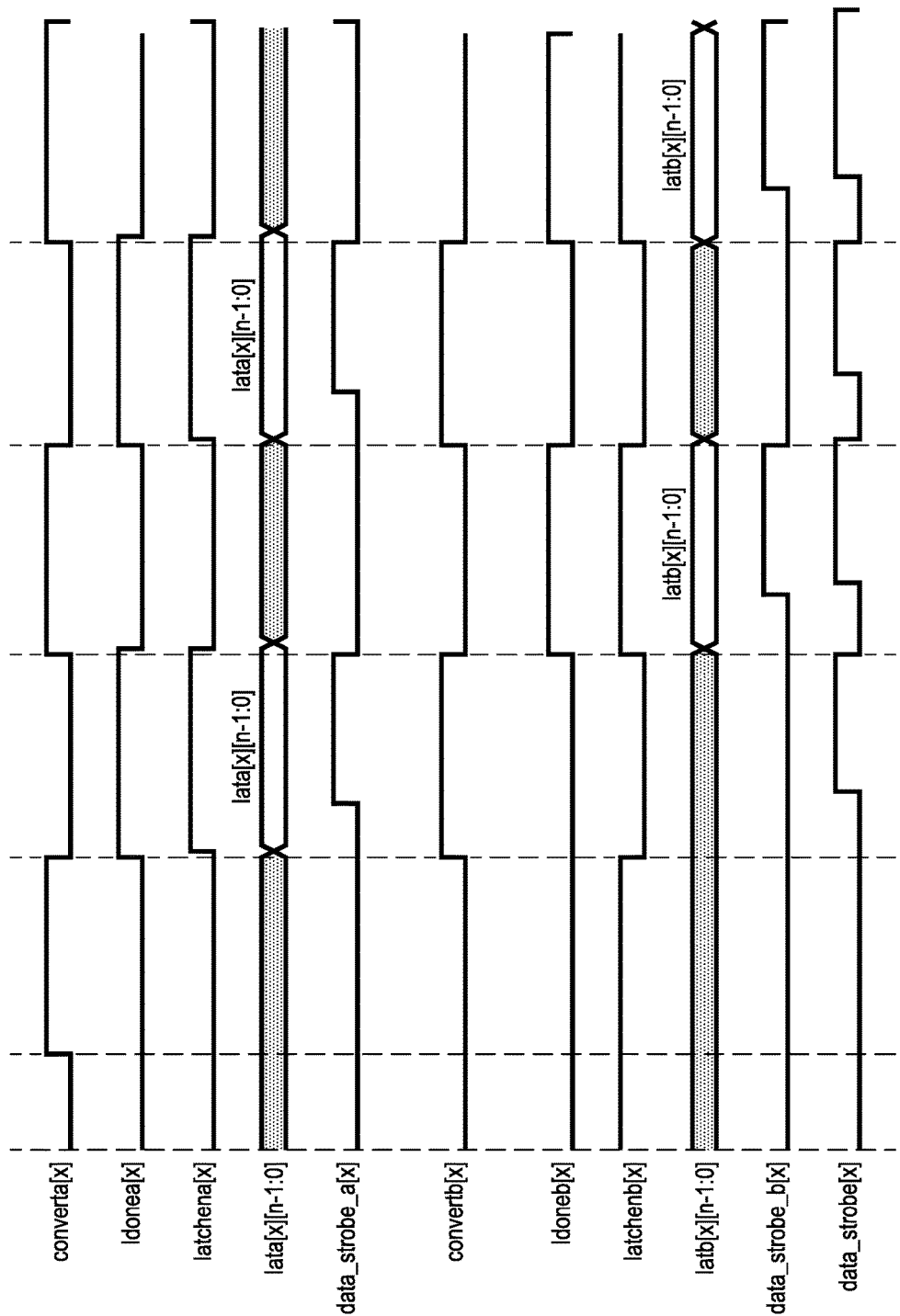
FIG. 12 illustrates example timing of a comparator, according to embodiments of the present disclosure.

FIG. 12 illustrates example timing of a comparator 900, according to embodiments of the present disclosure.

Additions, changes, modifications, or other permutations of this disclosure may be made according to the knowledge, skill, and understanding of one of skill in the art.

The invention claimed is:

1. A voltage comparator, comprising:
a first input configured to receive a first analog voltage;
a second input configured to receive a second analog voltage;
a first digital delay line configured to propagate a digital input signal through a first delay circuit and the digital input signal through a second delay circuit; and an output circuit configured to provide a comparator output based upon whether the digital input signal propagated faster through the first or second delay circuit, the comparator output configured to identify whether the first analog voltage or the second analog voltage is greater, wherein the voltage comparator further includes a voltage to current converter circuit; and the first digital delay line is further configured to propagate the digital input signal after the first analog voltage is converted to a first current and the second analog voltage is converted to a second current wherein the first current drives the first delay circuit and the second current drives the second delay circuit.

2. The voltage comparator of claim 1, wherein:
the digital input signal represents a logic "0" or a logic "1".

3. The voltage comparator of claim 1, wherein:
the output circuit is further configured to provide the comparator output based upon whether the first current or the second current is greater.

4. The voltage comparator of claim 1, wherein:
the output circuit is further configured to identify that the first analog voltage is greater than the second analog voltage based on a determination that the first current is greater than the second current.

5. The voltage comparator of claim 1, wherein:
the output circuit is further configured to identify that the first analog voltage is greater than the second analog voltage based on a logical combination of the values representing the digital input signal propagated through the first delay circuit and the digital input signal propagated through the second delay circuit.

6. The voltage comparator of claim 1 further comprising:
a second digital delay line; and
a multiplexer;
wherein the first and second digital delay lines are configured to alternatively compare analog voltage inputs.

7. The voltage comparator of claim 1, further comprising a thermometer code logic circuit configured to interpret values representing the first analog voltage and the second analog voltage into a comparison identification for the output circuit.

8. The voltage comparator of claim 1, wherein the voltage to current converter is a transconductor configured to convert an input differential voltage between the first analog voltage and the second analog voltage into a differential current representing the first analog voltage and the second analog voltage.

9. The voltage comparator of claim 1, wherein each of the first and second delay circuits includes a chain of current limited buffers.

10. The voltage comparator of claim 1, wherein:
a given differential digital delay line is configured to operate at a speed according to a differential current applied to the given differential digital delay line;
the comparator further comprises a latch; and
the latch is configured to save data from a slower differential digital delay line upon a completion of a faster differential digital delay line.

11. A microcontroller, comprising:
a plurality of voltage comparators, wherein a first voltage comparator comprises:
a first input configured to receive a first analog voltage;
a second input configured to receive a second analog voltage;
a first digital delay line configured to propagate voltage digital input signal through a first delay circuit and the digital input signal through a second delay circuit; and
an output circuit configured to provide a comparator output based upon whether the digital input signal propagated faster through the first or second delay circuit, the comparator output configured to identify whether the first analog voltage or the second analog voltage is greater, wherein the voltage comparator further includes a voltage to current converter circuit; and the first digital delay line is further configured to propagate the digital input signal after the first analog voltage is converted to a first current and the second analog voltage is converted to a second current wherein the first current drives the first delay circuit and the second current drives the second delay circuit.

12. The microcontroller of claim 11, wherein:
the digital input signal represents a logic "0" or a logic "1".

13. The microcontroller of claim 11, wherein:
the output circuit is further configured to provide the comparator output based upon whether the first current or the second current is greater.

14. The microcontroller of claim 11, wherein:
the output circuit is further configured to identify that the first analog voltage is greater than the second analog voltage based on a determination that the first current is greater than the second current.

15. The microcontroller of claim 11, wherein:
the output circuit is further configured to identify that the first analog voltage is greater than the second analog voltage based on a logic combination of the values representing the digital input signal propagated through the first delay circuit and the digital input signal propagated through the second delay circuit.

16. The microcontroller of claim 11, wherein the first voltage comparator further comprises:
a second digital delay line; and
a multiplexer;
wherein the first and second digital delay lines are configured to alternatively compare analog voltage inputs.

17. The microcontroller of claim 11, wherein the first voltage comparator further comprises a thermometer code logic circuit configured to interpret values representing the first analog voltage and the second analog voltage into a comparison identification for the output circuit.

18. The microcontroller of claim 11, wherein the voltage to current converter is a transconductor configured to convert an input differential voltage between the first analog voltage and the second analog voltage into a differential current representing the first analog voltage and the second analog voltage.

19. The microcontroller of claim 11, wherein each of the first and second delay circuits includes a chain of current limited buffers.

20. The microcontroller of claim 11, wherein:
a given differential digital delay line is configured to operate at a speed according to a differential current applied to the given differential digital delay line;
the first voltage comparator further comprises a latch; and
the latch is configured to save data from a slower differential digital delay line upon a completion of a faster differential digital delay line.

* * * * *